United States Patent
Filliman et al.

(10) Patent No.: US 6,404,255 B1
(45) Date of Patent: Jun. 11, 2002

(54) PHASE SHIFT APPARATUS

(75) Inventors: Paul D. Filliman; Mark Francis Rumreich, both of Indianapolis, IN (US)

(73) Assignee: Thomson Licensing S.A., Boulogne (FR)

( * ) Notice: Subject to any disclaimer, the term of this patent is extended or adjusted under 35 U.S.C. 154(b) by 1123 days.

(21) Appl. No.: 08/532,177

(22) Filed: Sep. 22, 1995

(51) Int. Cl.[7] .................... H03K 3/00; H03K 5/13
(52) U.S. Cl. ............... 327/231; 327/231; 327/235; 327/237; 327/248
(58) Field of Search .................. 327/231, 233–235, 327/240, 248–253, 258, 238, 239, 237; 331/12, 135

(56) References Cited

U.S. PATENT DOCUMENTS

| | | | |
|---|---|---|---|
| 3,973,221 A | | 8/1976 | Jett, Jr. ............ 331/116 |
| 4,020,500 A | | 4/1977 | Harwood ............ 358/19 |
| 4,128,817 A | | 12/1978 | Gomi ............ 331/177 |
| 4,297,641 A | * | 10/1981 | Sterzer ............ 327/248 |
| 4,395,687 A | | 7/1983 | Belohoubek ............ 333/164 |
| 4,733,200 A | | 3/1988 | Ecklund et al. ............ 331/116 |
| 4,797,634 A | | 1/1989 | Filliman et al. ............ 331/12 |
| 4,868,428 A | * | 9/1989 | Cooper ............ 327/248 |
| 5,157,276 A | * | 10/1992 | Metz ............ 327/237 |
| 5,485,128 A | * | 1/1996 | Azuma ............ 327/250 |

OTHER PUBLICATIONS

Copy of European Search Report for Corresponding EPO Application.

* cited by examiner

*Primary Examiner*—Tuan T. Lam
(74) *Attorney, Agent, or Firm*—Joseph S. Tripoli; Robert D. Shedd

(57) ABSTRACT

A source (20) provides an input signal (S1) to be phase shifted and a combining circuit (24) concurrently combines first (A), second (B) and third (C) intermediate signals derived from the input signal (S1), and having differing phase shifts (0, −45, +135 deg), to form a phase shifted output signal (S2). A first amplitude controller (34, 38, 30, 32), responsive to a phase control signal (S3) supplied thereto, varies the amplitudes of the second (B) and third (C) intermediate signals in opposite directions (38) for controlling the phase of the phase shifted output signal. Additionally, a further amplitude controller (40, 42) is provided for reducing a tendency for variations in the phase shift control signal (S3) to alter the amplitude of alternating current (FIG. 5) and direct current (FIG. 6) components of the phase shifted output signal (S2).

17 Claims, 5 Drawing Sheets

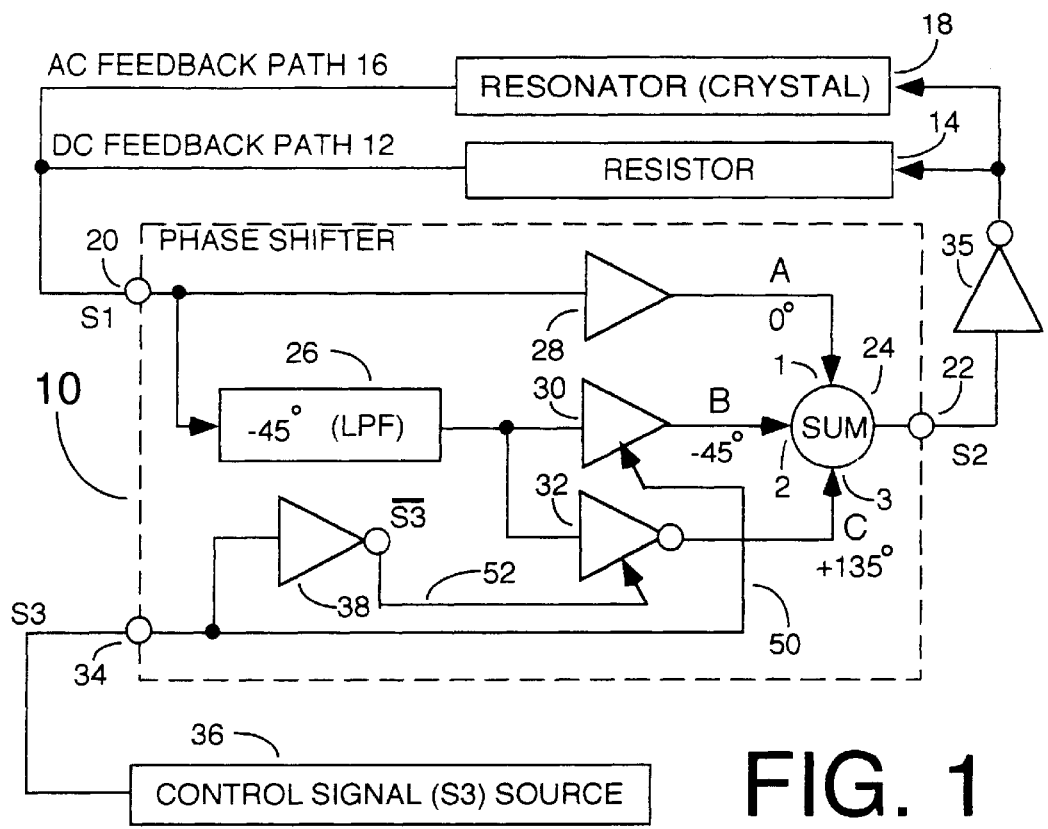
FIG. 1
(PRIOR ART)
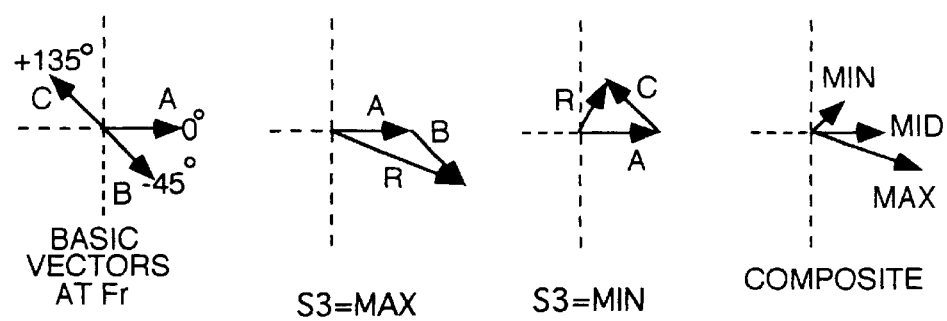
| BASIC VECTORS AT Fr | S3=MAX | S3=MIN | COMPOSITE |
| --- | --- | --- | --- |
| FIG. 2A (PRIOR ART) | FIG. 2B (PRIOR ART) | FIG. 2C (PRIOR ART) | FIG. 2D (PRIOR ART) |
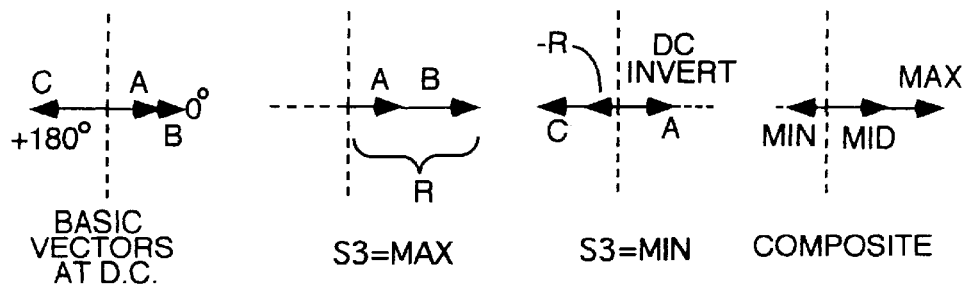
| BASIC VECTORS AT D.C. | S3=MAX | S3=MIN | COMPOSITE |
| --- | --- | --- | --- |
| FIG. 3A (PRIOR ART) | FIG. 3B (PRIOR ART) | FIG. 3C (PRIOR ART) | FIG. 3D (PRIOR ART) |

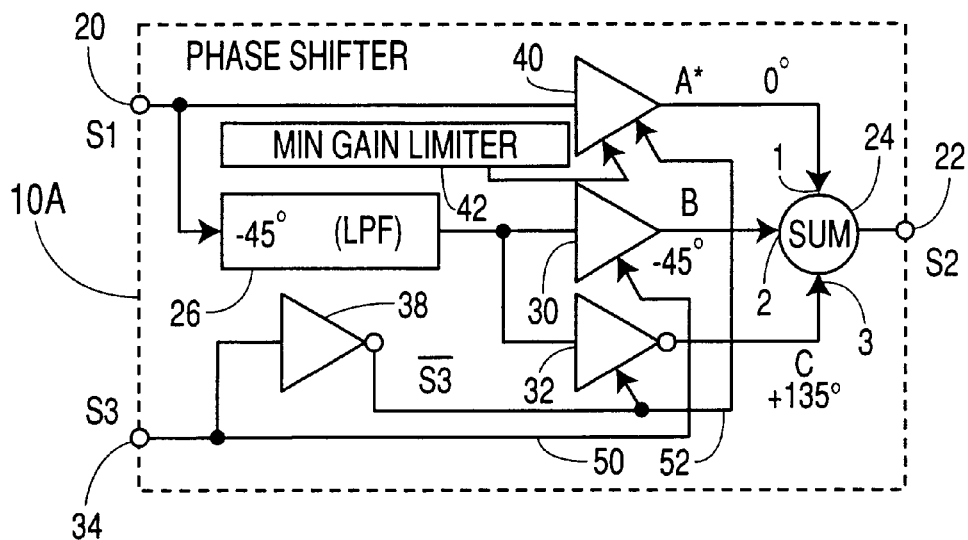
FIG. 4
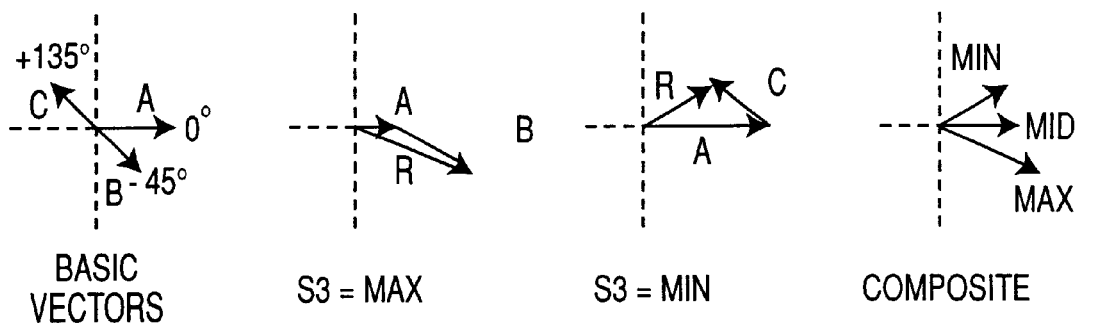
| BASIC VECTORS | S3 = MAX | S3 = MIN | COMPOSITE |
| --- | --- | --- | --- |
| FIG. 5A | FIG. 5B | FIG. 5C | FIG. 5D |
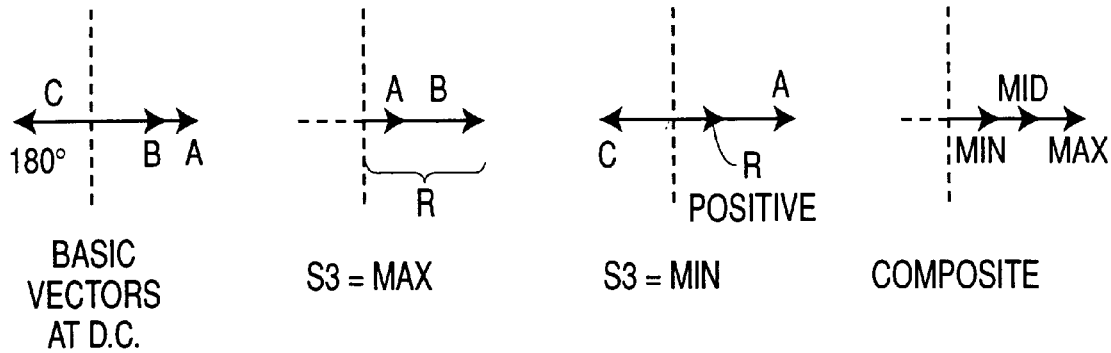
| BASIC VECTORS AT D.C. | S3 = MAX | S3 = MIN | COMPOSITE |
| --- | --- | --- | --- |
| FIG. 6A | FIG. 6B | FIG. 6C | FIG. 6D |

PHASE SHIFT APPARATUS

FIELD OF THE INVENTION

This invention relates to phase shift apparatus and particularly to variable phase shifters of a type in which plural phase shifted components of an input signal are formed and combined in proportions determined by a phase shift control signal to provide a phase shifted output signal.

BACKGROUND OF THE INVENTION

Variable phase shift apparatus are useful, for example, as phase control elements in voltage controlled oscillators, tuning circuits, filters and in similar applications where controlled phase shift is needed. For example, in U.S. Pat. No. 4,020,500 entitled CONTROLLED OSCILLATOR which issued Apr. 26, 1977 to L. A. Harwood, there is described a voltage controlled crystal oscillator in which phase shift for controlling the oscillator frequency is provided by vector summation. Specifically, an oscillator signal is phase shifted by +90 degrees by means of a two-pole L-C low pass filter and combined with the original signal to produce a resultant vector lying between 0 degrees and a leading angle (e.g., +45 degrees) with the angle being controllable by varying the amplitude of the +90 degree (quadrature) signal. For providing lagging phase shifts (e.g., from 0 degrees to about −45 degrees) the polarity of the quadrature vector is inverted to be −90 degrees rather than +90 degrees and the inverted quadrature vector is added to the reference or input signal. Here the resultant vector lies between 0 degrees and a lagging angle between 0 degrees and about −45 degrees with the angle being controllable by varying the amplitude of the −90 degree vector.

A phase shift circuit, in an oscillator application, which avoids the need for quadrature phase shifting elements (e.g., 90 degree two-pole filtering) is described by Paul D. Filliman in his U.S. Pat. No. 4,797,634 entitled CONTROLLED OSCILLATOR which issued Jan. 10, 1989. Unlike the Harwood arrangement, the Filliman phase shifter combines three vectors at a time rather than two. The vector angles used are −45 degrees, 0 degrees and +135 degrees with respect to the input signal and the mixture of these three vectors provides all phase shifts, both positive (leading) and negative (lagging). Also, since the +135 degree vector is produced from the −45 degree vector by inversion, and since the −45 degree shift may be provided by a one-pole RC filter, the entire phase shift circuit may be readily constructed in integrated circuit form in applications such as providing phase control of color oscillators in television related products.

FIG. 1 herein presents a simplified block diagram of the Filliman oscillator. As shown, a phase shifter 10 is provided with two feedback paths comprising (i) a DC path (12) via a resistor (14) which regulates the DC operating point of the oscillator by means of negative feedback and (ii) an AC feedback path (16) through a resonator (18, e.g., a crystal) which provides positive feedback with a gain of unity for causing oscillations to occur.

Phase shifter 10, as illustrated in FIG. 1, is non-inverting whereas oscillator applications require inversion to provide the proper negative DC feedback for bias stabilization and positive AC feedback signal at the nominal resonator frequency, Fr, for causing oscillations to occur. The inversion of the feedback signal for oscillator applications is provided in FIG. 1 by an inverter 35 at the phase shifter output 22. Optionally, inversion may be applied at various places. For example, the inverter 35 may just as well be placed at the input 20 of the phase shifter 10 or within the phase shifter. Also, inversion may be provided by simply using the inverting output of a differential output amplifier in the phase shift network 10 or by using an inverting form of summing amplifier 24 at the phase shifter output. What is of importance to the present invention is not whether the shifter inverts or not, but how the phase shifting is accomplished as will be described.

Phase shifter 10 includes an input terminal 20 for receiving the oscillator input signal S1 to be phase shifted and an output terminal 22 for providing a phase shifted output signal S2. The input signal S1 separated into three "intermediate" signals or "vector" components "A", "B" and "C" which are summed via a summing circuit 24 to provide a phase controlled output signal S2 at the network 10 output terminal 22. Hereinafter, the terms "intermediate" signals or components may be used interchangeably with the term "vector" signals or components.

The processing of the input signal S1 to form the intermediate signals or vector components "A", "B" and "C" is provided by a constant gain amplifier 28, two variable gain amplifiers 30 and 32 (the latter of which is inverting) and a 45 degree phase lag network 26. Vector "A" in FIG. 1 has a phase angle of zero degrees with respect to the input signal S1 and is produced by applying the input signal to the summing circuit 24 via a non-inverting fixed gain amplifier 28.

Vector "B" has a phase angle of −45 degrees relative to the input signal S1 and is produced by phase shifting the input signal by 45 degrees (lagging) at the nominal frequency of the resonator 18 in the phase shift network 26 (e.g., a low pass filter). The phase shifted signal "B" is then applied to summing circuit 24 via a variable gain non-inverting amplifier 30.

Vector "C" has a phase angle of +135 degrees relative to the input signal S1 and is produced by inverting the output of the 45 degree phase shift network 26 with a controllable gain inverting amplifier 32 for application to summing circuit 24. A phase shift control signal 53 is applied directly to the gain control input of amplifier 30 and is inverted by means of an inverter 38 for application to the gain control input of inverting amplifier 32.

In operation, due to the action of the inverter 38, an increase in control signal S3 at terminal 22 will cause an increase in the amplitude of the vector "B" and concurrently will cause a decrease in the amplitude of the vector "C". This will produce a lagging phase for the output signal S2 relative to the input signal S1. Conversely, a decrease in the control signal S3 will cause a decrease in the amplitude of vector "B" and an increase in the amplitude of vector "C". This will produce a leading phase for the output signal S2 relative to the input signal S1. When changing phase angles, the amplitude of vector "A" is held constant. It is the variation of the amplitudes of vectors "B" and "C" which controls the net phase shift of the network and thus the frequency of the oscillator.

SUMMARY OF THE INVENTION

It has been found that under certain special circumstances (e.g., improper amplifier gains or gain variations) the Filliman type of oscillator, employing a three-vector phase shifter of the type described, may exhibit one, or more, of the following three operating difficulties: (i) stopped oscillations; (ii) overtone oscillations; and (iii) bias instability.

The problems noted above have been found to be traceable to the phase shift portion of the oscillator. It has also been found that the problems with the oscillator may be reduced by the expedient of restricting the phase range of the phase shifter. This, however, is not a completely satisfactory solution since it limits the oscillator frequency range and thus limits the range of useful applications for the oscillator.

Phase shift apparatus, embodying the invention, includes a source providing an input signal to be phase shifted and a combining circuit for combining first, second and third intermediate signals that are derived from the input signal, and have differing phase shifts, to form a phase shifted output signal. A first amplitude control circuit, responsive to a phase control signal supplied thereto, varies the amplitudes of the second and third intermediate signals in opposite directions for controlling the phase of the phase shifted output signal. Additionally, means are provided for reducing a tendency for variations in said phase shift control signal to alter the amplitude of the phase shifted output signal.

BRIEF DESCRIPTION OF THE DRAWING

The foregoing features of the invention are illustrated in the accompanying drawing, wherein like elements are denoted by like reference designators, and in which:

FIG. 1 is a simplified block diagram of a prior art oscillator employing a phase shift network of a three vector summation type;

FIGS. 2A–2D are vector diagrams illustrating certain aspects of normal operation of the phase shift network of FIG. 1;

FIGS. 3A–3D are "pseudo" vector diagrams illustrating certain aspects of abnormal operation which has been found to occur under certain circumstances in the phase shift network of FIG. 1;

FIG. 4 is a block diagram of a phase shift network embodying the invention;

FIGS. 5A–5D are vector diagrams illustrating normal operation of the phase shifter of FIG. 4;

FIGS. 6A–6D are "pseudo" vector diagrams illustrating certain aspects of operation of the phase shifter of FIG. 4;

DETAILED DESCRIPTION

Figure 7:
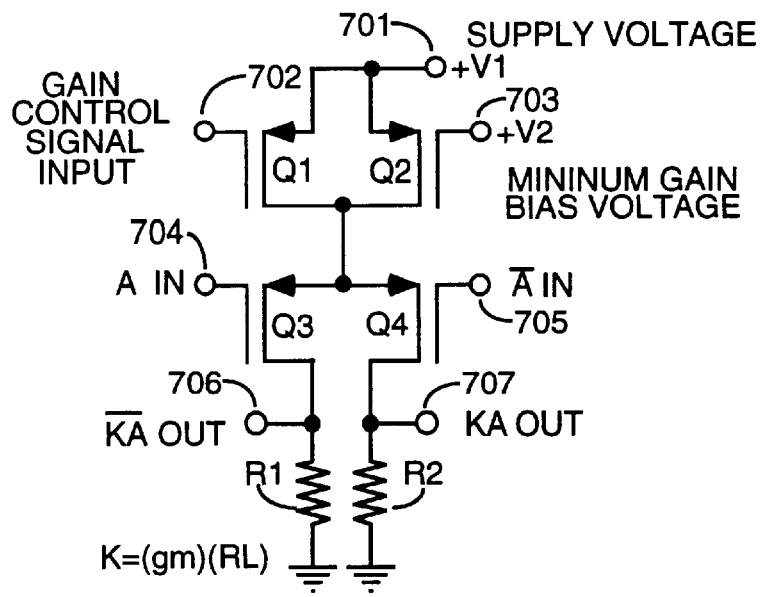
FIGS. 7, 8A and 8B are circuit diagrams illustrating suitable minimum gain limiting circuits suitable for use in the example of FIG. 4.

Before considering the details of the present invention, it is helpful to consider why the prior art three vector phase shifter of Filliman is subject to stopped oscillations, overtone oscillations and bias instability under certain circumstances and why restricting the phase control range overcomes these difficulties.

First, as to the stopped oscillations, if the open-loop gain ever drops below unity, the conditions for oscillation are no longer met. This can happen if the voltage-controlled phase shift circuit exhibits a significant decrease in gain at the fundamental frequency of the resonator for some values of control voltage. This problem is illustrated by FIGS. 2A and 2C. FIG. 2A is a vector diagram illustrating the three basic vectors in the phase shift circuit of FIG. 1, namely, "A" (at 0 degrees), "B" (at −45 degrees) and "C" at +135 degrees. All are assumed to have similar amplitudes. FIG. 2C illustrates the resultant phase shift (vector "R") for a condition in which the phase angle control signal is at a minimum value (e.g., zero). In this case vectors "A" and "C" when summed in summing circuit 24 produce a resultant vector "R" that is much smaller than either vector "A" or vector "C". From this it is apparent that, at the minimum phase control signal value (S3=0), the gain of the phase shift circuit is substantially less than unity and so oscillations may cease. Accordingly, for this case one would like to increase the phase shifter gain.

Second, regarding the overtone oscillations, if the open-loop gain ever exceeds unity at an out-of-band frequency, a condition for spurious oscillation is fulfilled. This typically happens at the third overtone of the crystal, which acts like a bandpass filter at the fundamental frequency and at odd harmonics of the fundamental. A low-pass filter is normally incorporated in crystal networks (resonator) to curb this problem but excess gain in the voltage-controlled phase shift circuit as a function of control voltage can still result in overtone oscillation. FIG. 2B illustrates this excess gain condition. In FIG. 2B the phase shift control signal S3 is shown at a maximum value. In this case, because of the inversion in inverter 32, the vector "C" is zero and the vectors "A" and "B" are both full valued. Their vector sum or the resultant output signal "R" produced by summing circuit 24 is much larger than either of the individual vectors thus indicating a gain increase. If, in oscillator applications, the gain increase is sufficiently large, as noted above, spurious oscillations may occur. Thus for this case, one would wish to decrease the phase shifter gain.

In the above two examples it is seen that for sustained oscillations one would like to increase the gain of the phase shift network at minimum values of the phase shift control signal S3. However, for reduced spurious signals one would like to decrease the phase shifter gain at maximum values of the control signal S3. These differing gain requirements are illustrated in the composite vector diagram of FIG. 2D which presents the resultant vectors for minimum, maximum and midrange values of the control signal S3. To solve this problem one might be tempted to merely vary the gain of the buffer amplifier 35 as a function of the control signal S3. Such a hypothetical solution, however, will not work.

In accordance with an aspect of the invention, the reason that it is not possible to correct the problems of stopped oscillations and overtone oscillations by merely varying the amplitude of the resultant vector "R", is because of a third gain problem concerning the circuit operation at very low frequencies. By "low" frequencies it is meant that the phase shift provided by the 45 degree phase shifter 26 is reduced to a very low value (e.g., a few degrees) or, at zero Hz where there is no phase shift at all provided by low pass filter 26.

Specifically, it has been found that at very low, or zero, frequencies, where filter 26 provides no significant delay and so no appreciable phase shift, that under a certain condition of the control signal S3 the "polarity" of the resultant vector "R" may be reversed.

More specifically, if the "DC" or low frequency gain approaches zero (or worse yet, crosses zero and changes polarity), bias instability can result. Depending on the DC bias method used in the application circuit, changes in DC or low frequency gain can shift the DC operating point of the loop, resulting in stopped oscillation or an unsatisfactory duty cycle or, for the phase inversion case, a latch-up condition in which the DC feedback is positive and the circuit acts like a latch. This problem is illustrated by the vector diagrams of FIGS. 3A–3D. These diagrams are similar to those of FIGS. 2A–2D except that they are made for the condition that the input signal frequency is zero (i.e., it is a direct current, DC).

At DC, the low pass filter 26 provides approximately 3 dB higher amplitude than at the nominal (resonator) frequency and there is no associated phase shift. The reason for the 3 dB gain increase is that the low pass filter 26 introduces a 3 dB loss at the resonator frequency to obtain a −45 degrees of phase shift and this loss is corrected by adjustment of the gains of amplifiers 30 and 32 or the weighting of summer 24. This, at DC the amplitude compensated low pass filter will exhibit a net gain of 3 dB (i.e., a gain of 1.414). Accordingly, the vectors "B" and "C" are larger than vector "A" and are on-axis with respect to vector "A". This is illustrated by the basic vectors of FIG. 3A. For both of these reasons (B,C>A & all on axis) the voltage controlled phase shifter exhibits an even higher gain sensitivity (to the control voltage S3) at DC and low frequencies than at the nominal frequency of the resonator 18.

FIG. 3B shows the resultant "R" for the case where the phase control signal S3 is a maximum. FIG. 3C illustrates the opposite case where S3 is a minimum (zero). For this case vector "B" is zero and vector "C" is at its maximum. This, however, at DC and low frequencies, is 3 dB greater than vector "A". As a result, the phase of the resulting vector "R" is reversed 180 degrees. This, in a oscillator application where the DC feedback must be negative, will cause positive feedback and therefore latch-up of the overall circuit stopping the oscillations. This undesirable condition is shown in FIG. 3D which illustrates a composite of the three resultant vectors for minimum, midrange and maximum values of the control signal S3. As seen, with the phase control signal S3 at its minimum value, the phase of the resultant vector "R" is reversed.

FIG. 4 is a block diagram of phase shift apparatus embodying the invention in which means are provided for reducing the tendency for variations in the phase shift control voltage S3 from altering the amplitude of the phase shifted output signal S2. This is achieved in a way such that the phase of the phase shifted output signal does not reverse for any value of the phase control signal.

The phase shifter 10 in FIG. 4 is similar to the phase shifter of FIG. 1 except that (1) the fixed gain amplifier 28 of FIG. 1 is replaced by a variable gain amplifier 40 in FIG. 4, (2) the gain control for amplifier 40 is obtained from the same bus 52 that controls the gain of inverting amplifier 32 and (3) a minimum gain limiter 42 is connected to the variable gain amplifier 40.

Operation of the phase shifter 10A is illustrated by FIGS. 5A–5D and 6A–6D. FIG. 5A illustrates the three basic vectors used in the summation which are of equal amplitude and at angles of 0, −45 and +135 degrees.

FIG. 5B illustrates the case where the phase control signal S3 is at a maximum value thus making an increase in vector "B", a decrease to zero of vector "C" and reducing vector "A" to the minimum value determined by the minimum gain limiter 42. This produces a lagging resultant vector R which is slightly larger than vector "B".

FIG. 5C illustrates the other extreme of the control signal S3 when S3 is set to a minimum value (e.g., zero). In this case the gain of amplifier 30 is reduced to zero so the amplitude of vector "B" is zero. The amplitude of vector "A" is increased by amplifier 40. The sum "R" of the vectors "C" and "A" is a leading vector of about the same size as in FIG. 5B. FIG. 5D is a composite vector diagram illustrating the resultant vectors for minimum, midrange and maximum values of the phase control signal S3. As shown, there is little difference in amplitude of the resultant vector "R" over the full range of signal S3.

From the foregoing, it has been seen that the gain of the overall phase shifter circuit 10A has been stabilized at the nominal operating frequency where the phase shift of filter 26 is 45 degrees. Consideration will now be given to the amplitude response at DC and low frequencies where the phase shift of filter 26 is negligible.

As in the previous discussion, it is assumed that the gains of all vectors are normalized at the nominal frequency of operation of the phase shifter. This would be near the resonator frequency in oscillator applications. This at DC and low frequencies the vectors "B" and "C" at a mid range setting will be larger (by 3 dB) than vector "A". FIG. 6A illustrates this vector relationship of the "basic" vectors at DC and low frequencies. FIG. 6B illustrates a case where the phase control signal S3 is set to a maximum value. In this case the amplifier 32 will reduce the magnitude of vector "C" to zero and amplifier 40 will reduce the amplitude of vector "A" to the minimum value determined by the minimum gain limiter 42. Thus the resultant vector "R" will equal the sum of the minimum "A" value plus the increased amplitude of vector "B". As illustrated, there is no polarity of the resultant vector for this maximum setting of the phase control signal S3.

FIG. 6C illustrates a case where the phase control signal S3 is reduced to its minimum (zero) value. This decreases the gain of amplifier 30 thus making the amplitude of vector "B" equal to zero. Amplifiers 40 and 32 both exhibit increase gains since they receive the inverted (S3-bar) phase control signal. The maximum gain of amplifier 40, however, is selected to be sufficiently larger than that of amplifier 32 to that the vector "A" is larger than vector "C" under the assumed condition. A suitable gain difference is on the order of about 6 dB which allows for some amplifier gain tolerance variations. As a result, the resultant vector "R" is positive (i.e., non-inverted) for this minimum setting of the phase control signal S3. FIG. 6D is a vector diagram that is a composite of three values of the phase control signal, namely, minimum, midrange and maximum. Although this diagram shows gain variation at DC and low frequencies, the phase does not invert for any setting of the phase control signal S3.

In the foregoing example of the invention, a variable gain amplifier 40 was used for varying the amplitude of the intermediate signal (vector "A") and a minimum gain limiter 42 was connected to the amplifier 40. FIG. 7 is a detailed circuit diagram of a variable gain differential amplifier suitable for use as amplifier 40 and minimum gain limiter 42. The amplifier includes a pair of source coupled transistors Q3 and Q4 having drain loads R1 and R2 coupled to ground and to output terminals 706 and 707. The quiescent currents of transistors Q3 and Q4 are varied to vary the transconductance (gm) of the amplifier thereby producing a variable gain K proportional to the product of the variable transconductance and the load value (RL).

For transconductance control, a transistor Q2 is provided operating at a fixed gate to source bias applied to terminals 701 and 703. This transistor, in other words, is biased for operation as a fixed current source. Accordingly, the transconductance of the differential amplifier transistors Q3 and Q4 can not be less than that determined by the constant current provided by transistor Q2. This corresponds to the action of the minimum gain limiter 42 in FIG. 4.

Variable gain control is provided by a transistor Q1 having a fixed source voltage an a gate voltage that varies with the control signal applied to the control input 702 thus forming a variable current source. Thus as the phase control signal varies the current provided by transistor Q1 also varies thus controlling the transconductance of transistors Q3 and Q4. When the gain control voltage applied to terminal 702 biases transistor Q1 off, however, the transconductance does not reduce to zero since transistor Q2 still supplies a minimum current independent of the current provided by transistor Q1. The maximum gain is determined by the sum of the currents provided by both of the current source transistors.

Figure 8A:
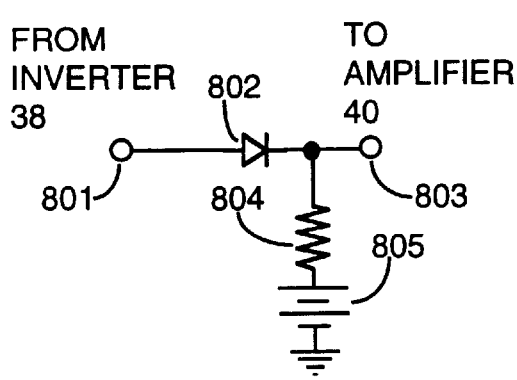
Figure 8B:
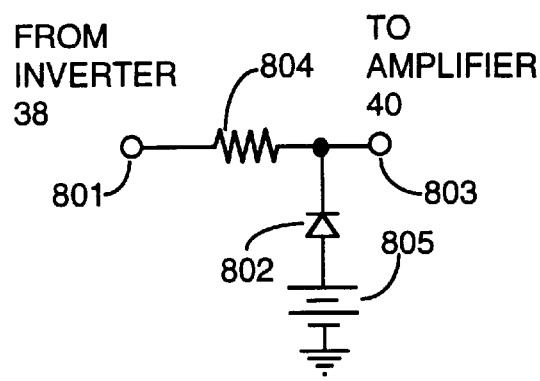
Figure 9:
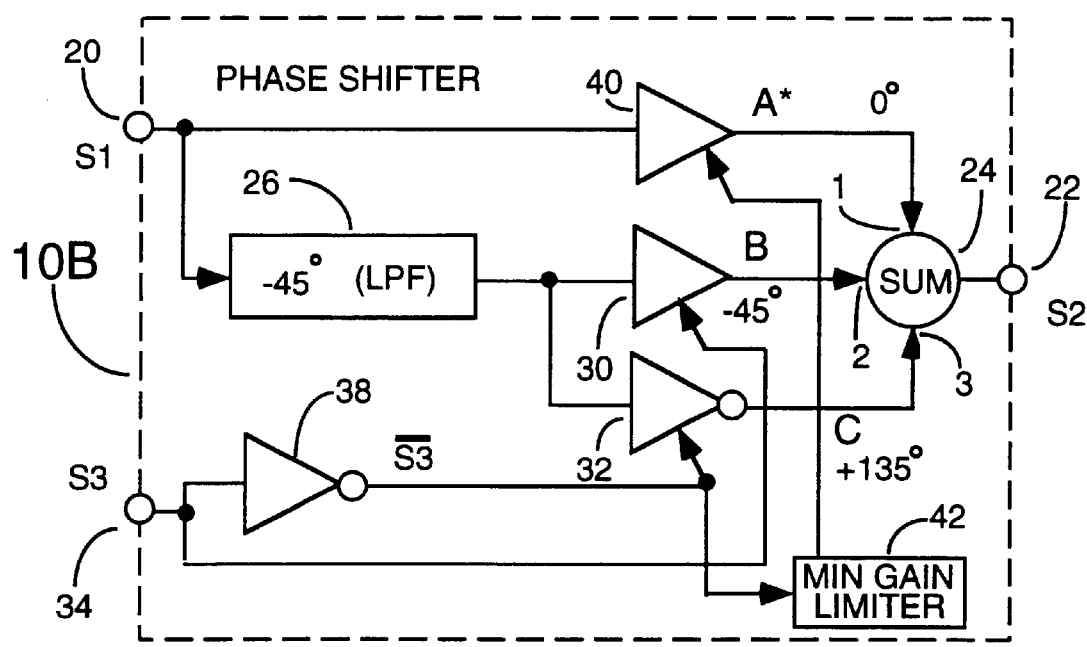
FIGS. 9, 10 and 11 are block diagrams illustrating modifications of the phase shifter of FIG. 4.

There are various other ways of setting a minimum amplitude for the vector "A". For example, FIG. 9 illustrates a modification of the phase shifter of FIG. 4 in which the minimum gain limiter 42 is placed in the control signal path for the gain control signal (S3-bar) of amplifier 40. For this purpose a clamp circuit may be used. FIGS. 8A and 8B illustrate two suitable clamp circuits. In FIG. 8A the control signal form inverter 38 is applied to an input terminal 801 which is coupled to an output terminal 803 via a diode 802. Terminal 803 is also coupled to ground via a resistor 804 and a source of reference voltage (illustrated as a battery) 805.

In operation, when the phase control signal is greater than the sum of the battery voltage and the forward drop of the diode 802, the diode will become conductive and supply a control signal to the variable gain amplifier 40 that varies with the phase control signal. However, at lower voltages the diode will be non-conductive and so the voltage applied to the gain control input of amplifier 40 will be a constant value equal to the reference source 805 voltage. The clamp circuit of FIG. 8B is similar to that of FIG. 8A except that the diode 802 and resistor 804 are interchanged. In operation, for input voltages greater than the sum of the battery and diode voltages, the diode will be turned off and the output voltage to amplifier 40 will follow the control signal at terminal 801. Conversely, at lower voltages the diode will be forward biased thereby maintaining a constant gain control bias for amplifier 40 and thus establishing a minimum gain.

Figure 10:
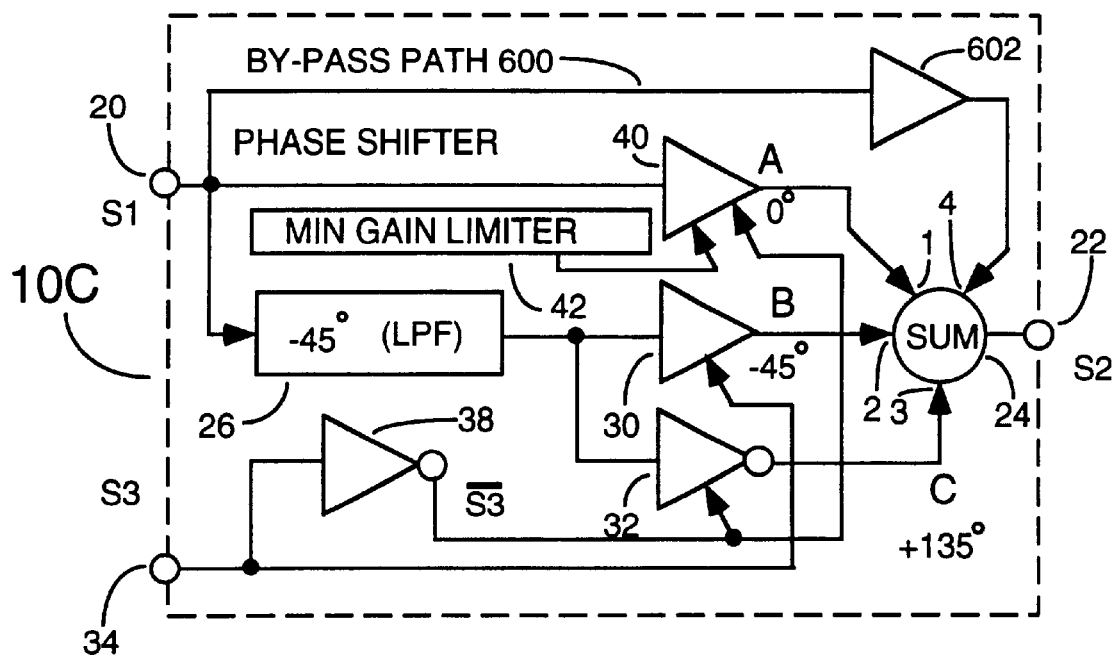
Figure 11:
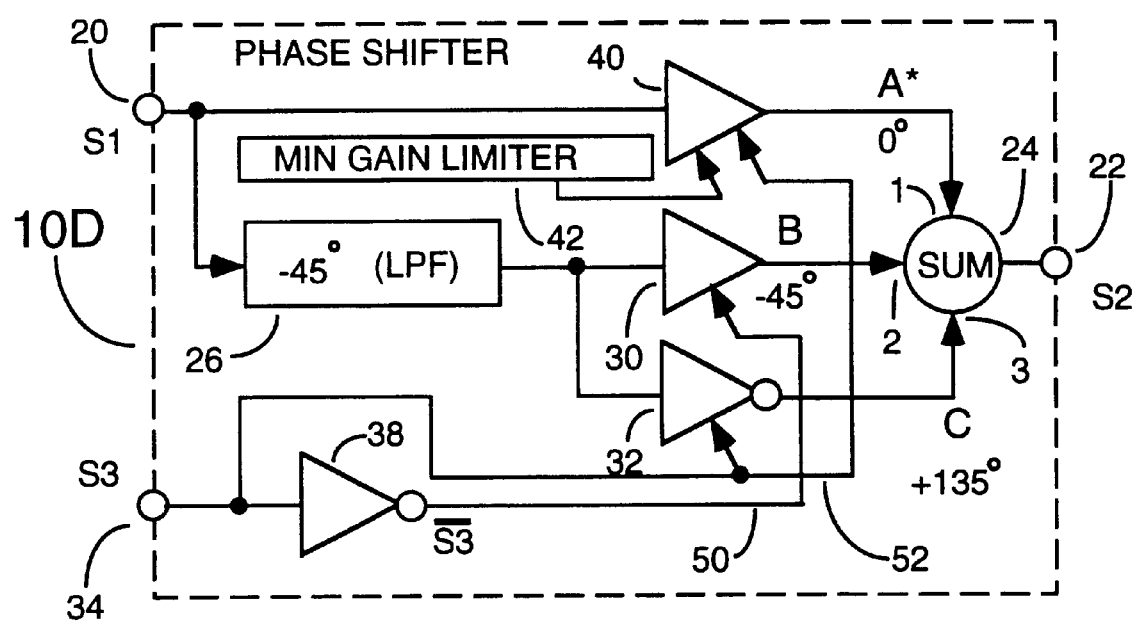

FIG. 10 is a block diagram illustrating a modification of the example of FIG. 4 in which the minimum gain limiter 42 is implemented by placing a by-pass path 600 containing an amplifier 620 around amplifier 40. This path ensures that even when amplifier 40 is biased to provide a zero output, vector "A" will still have a minimum value determined by the attenuator. FIG. 11 illustrates a modification of the phase shifter of FIG. 4 in which the inverter 38 is moved from phase control signal bus 52 to phase control signal bus 50. The circuit operation is the same as in FIG. 4 except that the phase shifts in the opposite direction as the phase control signal S3 varies.

What is claimed is:

1. Phase shift apparatus, comprising:
   a source providing an input signal to be phase shifted;
   summing means for summing first, second and third intermediate signals derived from said input signal and having differing phase shifts to form a phase shifted output signal;
   first amplitude control means responsive to a phase control signal supplied thereto for varying the amplitudes of said second and third intermediate signals concurrently and in opposite directions for controlling the phase of said phase shifted output signal; and
   second amplitude control means responsive to said phase control signal, for varying the amplitude of said first intermediate signal.

2. Phase shift apparatus, comprising:
   a source providing an input signal to be phase shifted;
   summing means for summing first, second and third intermediate signals derived from said input signal and having differing phase shifts to form a phase shifted output signal;
   first amplitude control means responsive to a phase control signal supplied thereto for varying the amplitudes of said second and third intermediate signal concurrently and in opposite directions for controlling the phase of said phase shifted output signal; and
   second amplitude control means responsive to said phase control signal, for varying the amplitude of said first intermediate signal and wherein:
   said first intermediate signal is in-phase with said input signal;
   said second intermediate signal is phase shifted by substantially 45 degrees with respect to said input signal; and
   said third intermediate signal is 180 degrees out of phase with respect to said second intermediate signal.

3. Apparatus as recited in claim 2 wherein:
   said first, second and third intermediate signals are phased with respect to said input signal at angles of 0, −45 and +135 degrees, respectively.

4. Apparatus as recited in claim 2 wherein:
   said first, second and third intermediate signals are phased with respect to said input signal at angles of 0, −45 and +135 degrees, respectively;
   said each of said first,second and third intermediate signals are amplified by respective ones of first, second and third amplifiers, each amplifier having a respective gain; and
   the gain of said first amplifier is greater than that of said third amplifier.

5. Apparatus as recited in claim 2 wherein said first intermediate signal is coupled from said source to said summing means via an amplifier and further comprising:
   amplitude limiting means coupled to said amplifier for setting a minimum amplitude of said first intermediate signal.

6. Apparatus as recited in claim 2 wherein said second amplitude control means comprises:
   an amplifier having a transconductance dependent upon the value of an operating current supplied thereto;
   a current source for supplying said operating current to said amplifier and for varying the operating current as a function of said phase control signal; and
   means for limiting the transconductance of said amplifier to a range of values from a minimum value to a maximum value.

7. Apparatus as recited in claim 2 wherein said second amplitude control means comprises:
   an amplifier having a transconductance dependent upon the value of an operating current supplied thereto;
   a first current source for supplying a fixed operating current to said amplifier thereby establishing a minimum value of transconductance for said amplifier; and
   a second current source responsive to said phase control signal for supplying a variable operating current to said amplifier thereby varying said transconductance from said minimum value provided by said first current source to a maximum value proportional to a sum of the currents provided by both current sources.

8. Phase shift apparatus, comprising:
   a source providing an input signal to be phase shifted;
   means for summing first, second and third intermediate signals, all derived from said input signal, to form a phase shifted output signal, said first intermediate signal being in-phase with said input signal, said second intermediate signal being phase shifted by substantially 45 degrees with respect to said input signal and said third intermediate signal being phase shifted by substantially 180 degrees with respect to said second intermediate signal;

first amplitude control means responsive to a phase shift control signal supplied thereto, for varying the amplitudes of said second intermediate signal and said third intermediate signal in opposite directions for controlling the phase of said phase shifted output signal; and second amplitude control means for varying the amplitude of said first intermediate signal in concert with amplitude variations of a selected one of said second intermediate signal and said third intermediate signal.

9. Apparatus as in claim 8 wherein:

said first intermediate signal is subjected to amplification in a first amplifier having a first gain;

said selected one of said second intermediate signal and said third intermediate signal is subjected to amplification in a second amplifier having a second gain; and said first gain of said first amplifier is greater than said second gain of said second amplifier.

10. Phase shift apparatus as recited in claim 8 further comprising:

third amplitude control means for setting a limit to the minimum amplitude of said first intermediate signal, said minimum amplitude being independent of variations in said phase control signal.

11. Apparatus as recited in claim 8 wherein said second amplitude control means comprises:

an amplifier to which said input signal is applied for producing said first intermediate signal, said amplifier having a transconductance dependent upon the value of an operating current supplied thereto;

a current source for supplying said operating current to said amplifier and for varying said operating current as a function of said phase control signal; and means for limiting the transconductance of said amplifier to a range of values from a minimum value to a maximum value.

12. Apparatus as recited in claim 8 wherein said second amplitude control means comprises:

an amplifier to which said input signal is applied for producing said first intermediate signal, said amplifier having a transconductance dependent upon the value of an operating current supplied thereto;

a first current source for supplying a fixed operating current to said amplifier thereby establishing a minimum value of transconductance for said amplifier; and a second current source responsive to said phase control signal for supplying a variable operating current to said amplifier so that said transconductance varies in a range from said minimum value provided by said first current source to a maximum value proportional to a sum of the currents provided by both current sources.

13. Phase shift apparatus, comprising:

an input terminal for receiving an input signal to be phase shifted, said input signal having a given frequency;

means for deriving from said input signal a first intermediate signal that is in-phase with said input signal;

means for phase shifting said input signal to provide a second intermediate signal that is phase shifted by substantially 45 degrees with respect to said input signal;

means for inverting said second intermediate signal to produce a third intermediate signal that is substantially 180 degrees out of phase with said second intermediate signal;

a source for providing a phase control signal;

first amplitude control means responsive to said phase control signal for varying the amplitude of said second intermediate signal directly with changes in said phase control signal and for varying the amplitude of said third intermediate signal inversely with changes in said phase control signal; and second amplitude control means responsive to said phase control signal for varying the amplitude of said first intermediate signal between a minimum value and a maximum value.

14. Phase shift apparatus, comprising:

a first input terminal for receiving an input signal to be phase shifted;

a second input terminal for receiving a phase control signal;

a three-input summing circuit having an output terminal for providing a phase shifted output signal;

a first amplifier coupled between said first input terminal and a first input of said summing circuit;

a second amplifier having an input coupled to said first input terminal via a phase shifter and having an output coupled to a second input of said summing circuit;

a third amplifier having an input coupled to an output of said phase shifter and having an output coupled to a third input of said summing circuit;

a first signal path for coupling said second input terminal to a gain control input of said second amplifier;

an inverter having an input coupled to said second input terminal; and a second signal path coupled between an output of said inverter and respective gain control inputs of said first and third amplifiers.

15. Apparatus as in claim 14 further comprising means coupled to said first amplifier for setting a minimum gain for said first amplifier that is independent of the level of said phase control signal.

16. Apparatus as in claim 14 wherein said first and third amplifiers have respective gains, the gain of said first amplifier being greater than that of said third amplifier.

17. Apparatus as in claim 14 wherein:

said first amplifier has a first gain;

said third amplifier has a second gain; and said first gain is greater than said second gain.

* * * * *